US007138748B2

(12) United States Patent
Choi et al.

(10) Patent No.: US 7,138,748 B2
(45) Date of Patent: Nov. 21, 2006

(54) METHOD OF ENLARGING A TRAVEL OF PIEZOELECTRIC SENSOR AND MEMS SWITCH EMPLOYING THE SAME

(75) Inventors: Doo Sun Choi, Daejeon-Si (KR); Taik Min Lee, Seoul (KR); Tae Jin Jae, Daejeon-Si (KR); Kyung Hyun Hwang, Daejeon-Si (KR)

(73) Assignee: Korea Institute of Machinery & Materials, Taejeon-Si (KR)

( * ) Notice: Subject to any disclaimer, the term of this patent is extended or adjusted under 35 U.S.C. 154(b) by 182 days.

(21) Appl. No.: 10/814,813

(22) Filed: Mar. 30, 2004

(65) Prior Publication Data

US 2004/0264878 A1 Dec. 30, 2004

(30) Foreign Application Priority Data

Mar. 31, 2003 (KR) ..................... 10-2003-0020169

(51) Int. Cl.
*H01L 41/08* (2006.01)

(52) U.S. Cl. ..................................................... 310/328

(58) Field of Classification Search ................ 310/328, 310/330

See application file for complete search history.

(56) References Cited

U.S. PATENT DOCUMENTS 4,672,257 A * 6/1987 Oota et al. .................. 310/328
6,481,667 B1 * 11/2002 Ho .......................... 244/99.11

FOREIGN PATENT DOCUMENTS

| | | | |
|---|---|---|---|
| JP | 62-5526 | * | 1/1987 |
| JP | 1-112629 | * | 5/1989 |
| JP | 08-152575 | * | 6/1996 |
| JP | 2000-30593 | * | 1/2000 |

OTHER PUBLICATIONS

Brown, E.R., "RF-MEMS Switches for Reconfigurable Integrated Circuits," *IEEE Transactions on Microwave Theory and Techniques*, vol. 46, No. 11, pp. 1868-1880 (Nov. 1998).

Kruglick, E.J.J., et al., "Lateral MEMS Microcontact Considerations," *Journal of Microelectromechanical Systems*, vol. 8, No. 3, pp. 264-271 (Sep. 1999).

Lee, H., "RF MEMS Switches," *Korean Technology Institute, Electronic Information Center*, pp. 1-19 (2002).

Rebeiz, G.M., "RF MEMS Switches and Switch Circuits," *IEEE Microwave Magazine*, pp. 59-71 (Dec. 2001).

Schiele, I., et al., "Comparison of Lateral and Vertical Switches for Application as Microrelays," *J. Micromech. Microeng. 9*, pp. 146-150 (1999).

* cited by examiner

*Primary Examiner*—Thomas M. Dougherty
(74) *Attorney, Agent, or Firm*—Ladas & Parry LLP

(57) ABSTRACT

The present invention relates to a method of enlarging a travel of a piezoelectric sensor and a MEMS switch employing an enlarging means employing the leverage theory. In accordance with the present invention, there is provided a MEMS switch capable of using a relatively low voltage, less than 5V, lowering power consumption isolation and insertion loss, and having application to a wide range of wireless communication systems such as PCS and wireless LAN.

10 Claims, 1 Drawing Sheet

METHOD OF ENLARGING A TRAVEL OF PIEZOELECTRIC SENSOR AND MEMS SWITCH EMPLOYING THE SAME

BACKGROUND OF THE INVENTION

1. Field of the Invention

The present invention relates to a MEMS switch employing a piezoelectric sensor, and more particularly, to a method of enlarging a travel of a piezoelectric sensor and a MEMS switch employing the enlarged travel of a piezoelectric sensor.

2. Description of the Related Art

Conventionally, a micro-electromechanical systems (MEMS) switch can be classified by means of an employed actuator into four types, such as dynamo-electrostatic, thermal expansion, dynamo-electromagnetic and piezoelectric types, and by means of a switching direction into two types, such as vertical contact and lateral contact types.

Firstly, the dynamo-electrostatic type of MEMS switch uses a curved surface electrode type or comb drive type. This kind of switch is mostly developed nowadays. This type of MEMS switch employs the principles that two electrodes are contacted when different polarity of voltages are applied to the two electrodes of which one is a stationary electrode and the other is a movable electrode spaced apart from the stationary electrode.

Generally, the manufacture of this type of switch is not difficult; however, it additionally needs the use of a chip for raising the voltage to be useful for the current RF devices due to the requirement of at least several decades of voltage, thereby increasing the manufacturing cost. The travel speed of the switch has a range of 1 to 200 seconds depending upon its structure.

Secondly, the dynamo-electromagnetic type of MEMS switch uses the theory of an electromagnet, which makes a magnetic field through a coil structure. While this type of switch can be operated by a relatively low voltages of about 5 Volts, when the structure of the switch becomes complex and hug, its power consumption comes to reach a number of hundreds mW.

The thermal expansion type of MEMS switch uses the theory that the volume of solid or liquid materials expands as its temperature increases. While a relatively low voltage of about 5 Volts can also operate this type of switch, this switch is very sensitive to an ambient temperature, its power consumption comes to reach a number of hundreds of mW, and conclusively its travel speed is too slow such that it becomes several decades of milli-seconds.

The piezoelectric type of MEMS switch uses the theory of piezoelectric materials of which volume is expanded when a voltage is applied. While this type of switch has the most prompt travel speed (100 nsec to 1 sec) among the abovementioned methods, the most large power can transmit when it drives, and, while it can be driven by a relatively low voltage, this strain can be a maximum of 0.1% of the length of the materials, thus, the use of the MEMS switch has a disadvantage that its travel length is no more than several decades or hundreds of nanometers.

In this connection, the raising of the operation voltage implies difficulties in adoption of a portable optical communication device or personal communication services, or the requirement of additional cost due to the sue of the voltage-raising device.

High level of power consumption means the reduction of working period per one charge of portable devices such as PCS, leapt computer, etc. The more the speed of data communication is accelerated, the more the need of the component having a prompt travel speed is increased. Furthermore, in RF applications such as PCS, laptop, WLAN etc., in which various approaches for integrating all components in one chip are accomplished, those skilled in the art are interested in MEMS components having a relatively small area.

MEMS is a technology of combining a computer and a very small mechanical device such as a sensor, a valve, a gear, a reflection mirror and a driver etc. mounted in the semiconductor chip. It is used as a vibration accelerator in an air-bag for an automobile A MEMS device comprises a micro circuit on a very small silicon chip which a part of mechanical devices have been manufactured.

Further examples of applications of MEMS include GPS sensors for tracking express parcel services and detecting a intermediate parcel treatment process; a sensor mounted on wings of an airplane provided with a number of tiny auxiliary ailerons for detecting and reacting to air flow depending upon variations of surface resistance of the wings of an airplane; and optical exchanging devices capable of exchanging optical signals to an individual passageway at a speed of 20 nsec.

As described hereinabove, while the piezoelectric type MEMS switch is capable of nearly solving the aforementioned problems since it allows a lowering of voltage and power consumption, and a raising of travel speed, since a travel length for a voltage below 5 volts is too small, it is impossible to apply the variable optical device such as optical switch, RF switch, filter, etc.

Eventually, the present invention provides a method of enlarging a travel length of the piezoelectric materials while its travel mechanism using a piezoelectric material is used as before.

SUMMARY OF THE INVENTION

The present invention provides a method of enlarging a travel length of the piezoelectric materials to utilize the abovementioned advantage of the piezoelectric materials to the utmost and to solve the disadvantage of limited travel length.

It is an object of the present invention to provide a method of enlarging a travel length of piezoelectric materials and a MEMS switch employing the enlarged travel length of piezoelectric materials by means of enlarging a nano-level of travel length up to at least about 10 times for using it as a switch device.

It is another object of the present invention to provide a MEMS switch employing means for enlarging a travel length of the piezoelectric materials, wherein the electrode is a lateral contact type, since a switching operation of the piezoelectric material has a relatively high switching pressure and stiffness to the lateral direction in comparison with the vertical direction.

A core technology of the present invention is a technique of enlarging the travel of the piezoelectric materials by using a leverage theory when the piezoelectric materials are driven with a potential difference applied by an actuator, and increasing the stiffness and switching pressure of the switch by employing the lateral contact type.

In accordance with the present invention, it is capable of enlarging the travel length of the piezoelectric materials about a decade to allow their use as switching means and the substitution of a linear MEMS switch for a non-linear semiconductor device such as pin diode or MOSFET, thereby decreasing the amount used of filters for linear characteristics, and promoting the properties of isolation and insertion loss.

As described above, the switch, employed by a wireless LAN, etc., in accordance with the present invention is a non-linear semiconductor device such as pin diode or MOS-FET.

If a linear MEMS switch could substitute for it, it is capable of decreasing the amount used of filters and power consumption, and promoting the properties of isolation and insertion loss.

The MEMS switch, as described above, can be classified by means of an employed actuator into four types, such as dynamo electrostatic, thermal expansion, dynamo-electro-magnetic and piezoelectric types, and by means of a switching direction into two types, such as vertical contact and lateral contact types. (Reference: Lee, Hoyoung, RFMEMS Switch, Korean Electronics Technology Institute, Electronic Information Center, 2002,/G. M. Rebeiz and J-B, Muldavin, RF MFA4S switches and switch circuits, IEEE Mircrowave magazine, pp. 59–71, December 2001./ Elliott R. Brown, RF-MEMS Switches for Reconfigurable Integrated Circuits, IEEE Trans. on Microwave Theory and Tech, v.46, n.11. November 1988).

Conventionally, in the classification according to a switching method, the most currently used MEMS switch is the vertical contact type since the manufacture of a lateral electrode for lateral contact of the switch is difficult using the current semiconductor process. The present invention employs the lateral contact type switch as a manufacturing technique of the lateral electrode is developed more and more. The reason for employment of the lateral electrode is that it has a higher switching pressure and stiffness than the vertical electrode. (Reference: Ezekiel J. J. Kruglick, Kristofer S. J. Pister, Lateral MEMS Microncontact Considerations, J. of MEMS, v.8, n.3, September 1999./Ignaz Schiele and Bernd Hillerich, Comparison of Lateral and Vertical Switches for Application as Microrelays, J. Micromech. Microeng., pp 146–150, 1999.)

BRIEF DESCRIPTION OF THE DRAWING

These and other features, aspects, and advantages of preferred embodiments of the present invention will be more fully described in the following detailed description, in connection with the accompanying drawing. In the drawing.

DESCRIPTION OF THE PREFERRED EMBODIMENT

Figure 1:
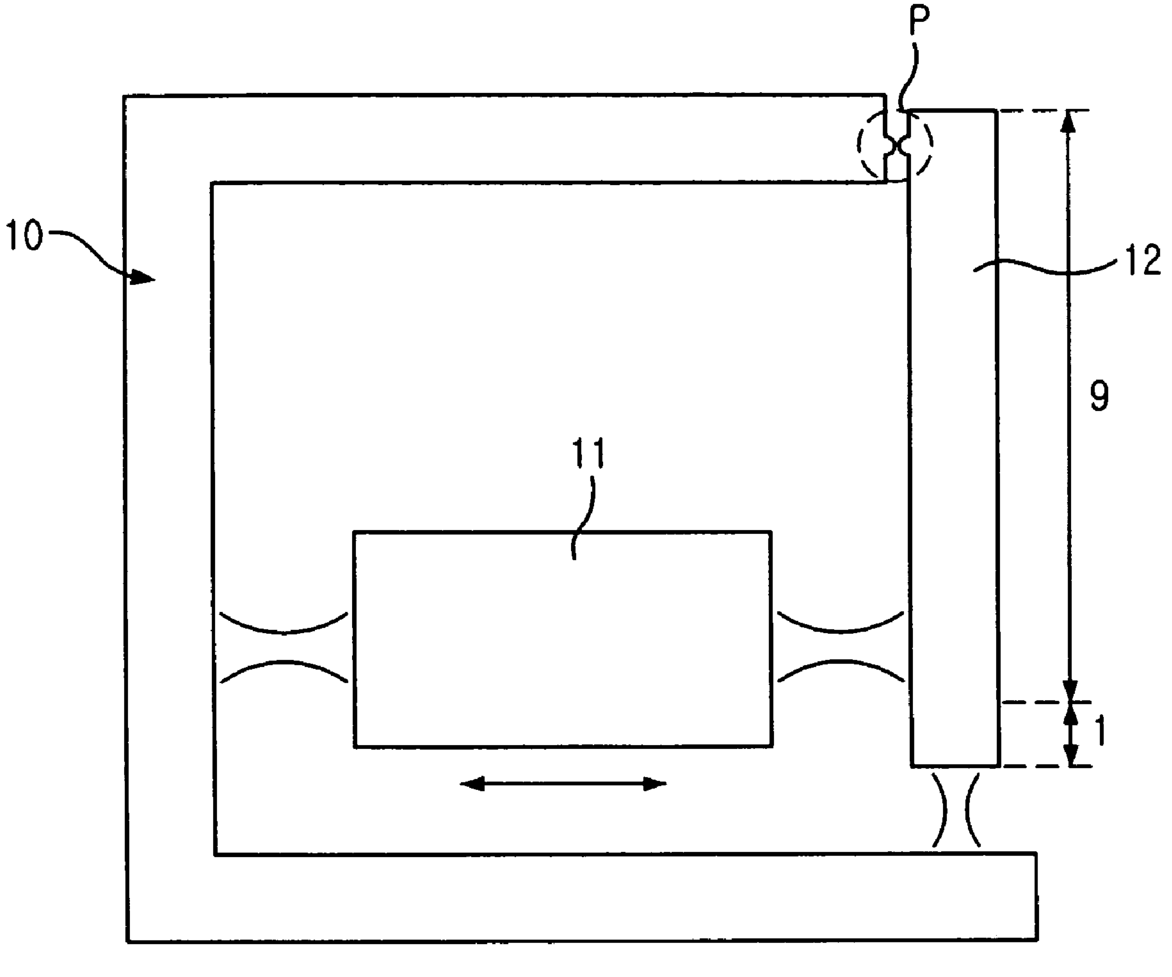
FIG. 1 is a plan view showing a means for enlarging of the travel length of a piezoelectric sensor of the present invention.

Hereinafter, the details of a method of enlarging a travel of piezoelectric sensor and a MEMS switch thereof will be described in connection with the accompanying drawing.

As shown in FIG. 1, the MEMS switch of the present invention is provided with a piezoelectric sensor 10 having first electrode P at its one end, an actuator 11 connected to the piezoelectric sensor 10 at one end of the actuator 11, and means 12 for enlarging the travel of the piezoelectric sensor 10, having second electrode P to face the first electrode at its one end, which is connected to the other end of the actuator 11 and elastically attached to the other end of the sensor 10 at its other end.

A method of enlarging a travel of the piezoelectric sensor 10 comprises the steps of:

firstly, shrinking the actuator 11 by applying a potential difference, secondly, enlarging the travel of the actuator 11 through the enlarging means 12, thirdly, switching the lateral contact switch by contacting the electrode P by installing the switching electrode to a lateral side of the piezoelectric sensor 10.

The above steps of the method of the present invention will be described more specifically as follows.

Firstly, the piezoelectric sensor 10 shrinking step uses the phenomenon that the piezoelectric materials is shrunk when the potential difference is applied to the piezoelectric material through the actuator 11. In the case of the conventional piezoelectric material having a maximum strain rate of about 0.1%, a piezoelectric material of 100 nm lengths has a strain displacement of 0.1 nm.

Therefore, the strain displacement of the piezoelectric materials becomes a base of driving force, and it is required that the above strain displacement is enlarged up to a sufficient level.

Secondly, in the enlarging step, the strain displacement is enlarged by the travel enlarging means 12 provided with a lever. Since the displacement is too small to be employed in a variable optical device such as an optical filter, optical switch, etc., and the use of a relatively big piezoelectric sensor for a large displacement results in an abandonment of the advantage of the MEMS switch, the enlargement of the displacement in a small structure is required. Therefore, the present invention provides a travel enlarging means capable of providing at least 10 times of travel enlargement by using the leverage theory.

Thirdly, in the switching step, when the electric charge is applied to the piezoelectric sensor 10 through the actuator 11, the switch becomes "On" as the lateral electrodes P are contacted with each other. When the electric charge is removed from the piezoelectric sensor 10, the lateral electrodes P are separated by an elastic recovering force of the leverage, thereby making the switch "Off."

As described hereinabove, the present invention provides a MEMS switch capable of using a relatively low voltage less than 5V, lowering power consumption, embodying a MEMS switch having excellent linear characteristics, embodying a switch having a low isolation and insertion loss, and applying to wide range of wireless communication such as PCS, wireless LAN etc.

While only a specific embodiment of the present invention has been described above, it will occur to a person skilled in the art that various modifications can be made within the scope of the appended claims.

What is claimed is:

1. A method of enlarging a travel of a piezoelectric sensor comprising the steps of:

providing an actuator connected at a one end of the actuator to the piezoelectric sensor;

shrinking the actuator by applying a potential difference;

providing an enlarging means having a proximal end and an end opposed to the proximal end, the opposed end of the enlarging means being elastically attached to the piezoelectric sensor and an end of the actuator opposed to the one end of the actuator being connected to the enlarging means; and enlarging the travel of the actuator by causing the shrinkage of the actuator to rotate the enlarging means about the opposed end of the enlarging means, wherein the piezoelectric sensor is provided with a first electrode and a second electrode is provided at the proximal end of the enlarging means whereby the first and the second electrodes may contact each other when the enlarging means is rotated due to shrinkage of the piezoelectric actuator.

2. A MEMS switch comprising:

a piezoelectric sensor having a first electrode at a one end of the piezoelectric sensor;

an actuator connected to the piezoelectric sensor at a one end of the actuator; and means for enlarging the travel of the piezoelectric sensor, having a second electrode to face the first electrode, the second electrode being provided at a one end of the means for enlarging, the means for enlarging being connected to an other end of the actuator and an other end of the means for enlarging being elastically attached to the other end of the sensor, whereby when the actuator is shrunk by the application of a potential difference the means for enlarging is rotated about the other end of the means for enlarging by the shrinkage of the actuator and the first and second electrodes are thereby brought into electrical contact.

3. The MEMS switch of claim 2, wherein the second electrode is a lateral electrode.

4. The method of claim 2 further comprising the step of switching a contact switch "on" by contacting the first electrode to the second electrode.

5. The method of claim 4 further comprising the step of switching a contact switch "off" by removing the application of a potential difference to the actuator and thereby removing the contact between the first electrode and the second electrode.

6. The MEMS switch according to claim 3 in which the MEMS switch is a lateral switch.

7. A MEMS switch comprising:

a piezoelectric sensor capable of being shrunk by the application of a potential difference and having a first electrode at a one end of the piezoelectric sensor;

an actuator connected at a one end of the actuator to the piezoelectric sensor;

means for enlarging the travel of the piezoelectric sensor having a second electrode at a one end of the means for enlarging, wherein the second electrode faces the first electrode, the means for enlarging is connected to an other end of the actuator, and the means for enlarging has an other end that is elastically connected to an other end of the piezoelectric sensor.

8. The MEMS switch according to claim 7 whereby when the piezoelectric sensor is shrunk by the application of a potential difference the means for enlarging is rotated about the other end of the means for enlarging by the actuator and the first and second electrodes are thereby brought into electrical contact.

9. The MEMS switch according to claim 8 wherein the means for enlarging is shaped like a lever having a one end and an other end.

10. The MEMS switch according to claim 8 whereby when the potential difference is removed from the piezoelectric sensor the means for enlarging is rotated about the other end of the means for enlarging by the actuator in an opposite direction by an elastic recovering force and the first and second electrodes are thereby brought out of electrical contact.

* * * * *